(12) United States Patent
Phark et al.

(10) Patent No.: US 9,514,971 B2
(45) Date of Patent: Dec. 6, 2016

(54) DOOR FOR THIN PLATE CONTAINER

(71) Applicant: 3S KOREA CO., LTD, Seoul (KR)

(72) Inventors: Joung Woo Phark, Anyang-si (KR); Jae Heung Yoo, Pyeongtaek-si (KR)

(73) Assignee: 3S KOREA CO., LTD., Seoul (KR)

( * ) Notice: Subject to any disclaimer, the term of this patent is extended or adjusted under 35 U.S.C. 154(b) by 587 days.

(21) Appl. No.: 14/113,364

(22) PCT Filed: Oct. 10, 2012

(86) PCT No.: PCT/KR2012/008191
§ 371 (c)(1),
(2) Date: Oct. 22, 2013

(87) PCT Pub. No.: WO2014/051189
PCT Pub. Date: Apr. 3, 2014

(65) Prior Publication Data
US 2016/0163575 A1 Jun. 9, 2016

(30) Foreign Application Priority Data
Sep. 27, 2012 (KR) .................. 10-2012-0107719

(51) Int. Cl.
*H01L 21/67* (2006.01)
*H01L 21/673* (2006.01)
(52) U.S. Cl.
CPC .............. *H01L 21/67373* (2013.01)
(58) Field of Classification Search
CPC ... H01L 21/67373; H01L 21/67; H01L 21/673
(Continued)

(56) References Cited

U.S. PATENT DOCUMENTS 5,915,562 A * 6/1999 Nyseth ............. H01L 21/67373
206/710
5,957,292 A * 9/1999 Mikkelsen ........ H01L 21/67373
206/454
(Continued)

FOREIGN PATENT DOCUMENTS

JP        2008-112799 A    5/2008
KR        10-0444651 B1    8/2004
(Continued)

OTHER PUBLICATIONS

Korea Office Action dated Dec. 18, 2013, issued to the corresponding Korean Application No. 10-2012-0107719.
(Continued)

*Primary Examiner* — King M Chu
(74) *Attorney, Agent, or Firm* — Stein IP, LLC

(57) ABSTRACT

A door which closes an opening in a container body of a thin plate container. A door body has latch passage holes in the circumference thereof, which correspond to latch recesses in an inner circumferential surface of the opening, and a component installation space. A rotary cam is received in the component installation space and is rotated by manipulation. Latch arms, each having one end connected to the rotary cam in the component installation space, reciprocate depending on a direction of rotation of the rotary cam so that free end areas thereof enter or exit the latch recesses through the latch passage holes. When the rotary cam rotates in a locking direction, the latch arms move along straight lines until at least portions of the free end areas are inserted into the latch recesses and then pivot so that the free end areas are pressed toward the container body.

20 Claims, 9 Drawing Sheets

(58) Field of Classification Search
USPC .................................................. 206/710, 454
See application file for complete search history.

(56) References Cited

U.S. PATENT DOCUMENTS

| | | | | |
|---|---|---|---|---|
| 6,622,883 B1* | 9/2003 | Wu | .................... | H01L 21/67373 |
| | | | | 206/710 |
| 8,083,272 B1* | 12/2011 | Wu | .................... | H01L 21/67373 |
| | | | | 206/710 |
| 2004/0040884 A1* | 3/2004 | Pai | .................... | H01L 21/67373 |
| | | | | 206/710 |

FOREIGN PATENT DOCUMENTS

| KR | 20-0389390 Y1 | 7/2005 |
|---|---|---|
| KR | 10-0772845 B1 | 11/2007 |
| KR | 10-1006000 B1 | 1/2011 |
| KR | 10-1101075 B1 | 12/2011 |

OTHER PUBLICATIONS

International Search Report mailed Apr. 5, 2013, issued in corresponding International Patent Application No. PCT/KR2012/008191.

* cited by examiner

DOOR FOR THIN PLATE CONTAINER

CROSS-REFERENCE TO RELATED APPLICATIONS

This application is a national stage of International Application No. PCT/KR2012/008191, filed Oct. 12, 2012, which claims the benefit of Korean Application No. 10-2012-0107719, filed Sep. 27, 2012, in the Korean Intellectual Property Office. All disclosures of the document(s) named above are incorporated herein by reference.

BACKGROUND OF THE INVENTION

Field of the Invention

The present invention relates, in general, to a door for a thin plate container and, more particularly, to an improvement in a locking structure of a door for a thin plate container which can be used for the process of storing, transporting or manufacturing a thin plate, such as a semiconductor wafer, a memory disk or a liquid crystal glass substrate.

Generally, a thin plate container which can contain precision thin plates, such as a semiconductor wafer, a memory disk or a liquid crystal glass substrate, is configured such that it basically includes a container body having a thin plate containing space with one open portion and a door which opens and closes the container body.

Generally, a thin plate container which can contain precision thin plates, such as a semiconductor wafer, a memory disk or a liquid crystal glass substrate, is configured such that it basically includes a container body having a thin plate containing space with one open portion and a door which opens and closes the container body.

This thin plate container will be described herein by referring to a thin film plate container for semiconductor wafers as an example for the sake of convenience. Here, the thin film plate container for semiconductor wafers can be a thin film plate container for semiconductor wafers in which a door is opened at the upper and/or lower portions or at the side, including a front opening shipping box (FOSB) and a front opening unified pod (FOUP) type.

The thin film plate container for semiconductor wafers or the like includes a container body having an opening in at least one portion, a door which opens and closes the opening of the container body, and a locking unit which locks or unlocks the door.

In a typical thin plate container, when a rotary cam of a locking unit provided in the door is manipulated to rotate, a latch of the locking unit is latched into or unlatched from a latch recess formed in an opening of a container body while entering and exiting through a latch passage hole in a peripheral area of the door, thereby locking or unlocking the state in which the opening of the container body is closed by the door.

The locking or unlocking of the door of the thin plate container like this is performed by dedicated process equipment which automatically manipulates the rotary cam of the locking unit in a semiconductor fabrication process.

However, since the related-art door for a thin plate container is configured such that the latch is latched into or unlatched from the latch recess of the container body by simply moving along a straight line in response to the manipulation of the rotary cam by the locking unit, the door does not provide other effects in addition to the locking or unlocking of the state in which the opening of the container body is closed.

In situations where semiconductor wafers are being stored and carried, it is required to completely block the entrance of external contaminants. For this, a gasket is interposed between the door and the opening of the container body. However, the door for a thin plate container of the related art does not have any construction that can improve a sealing force in addition to the gasket.

In addition, in the case of closing the opening of the container body with the door, when the door is not properly brought into close contact with the container body, the latch of the locking unit is not properly inserted into the latch recess of the container body. This consequently causes a problem in that the process of opening or closing the door of the thin plate container in the semiconductor fabrication process cannot be automatically performed.

Accordingly, Korean Patent No. 10-1101075 (Dec. 23, 2011; Korean Laid-Open Patent Publication No. 10-2005-0062348 (Jun. 23, 2005)) and Korean Patent No. 10-1006000 (Dec. 28, 2010; Korean Laid-Open Patent Publication No. 10-2004-0100905 (Dec. 2, 2004)) disclosed "THIN PLATE SUPPORTING DOOR" pertaining to a technique in which a locking unit structure of a door for a thin plate container of the related art is improved such that the door is brought into close contact with a container body.

In "the thin plate supporting doors" of the related art, as shown in FIG. 1, the locking unit 110 is provided in a recess 103 which is formed as a part receiving space in the door 101. In this locking unit 110, when a cam-shaped input member 111 is manipulated to rotate, a free end of a latch-shaped engagement member 113 is inserted into or withdrawn from a latch recess (not shown) of a container body (not shown) while entering or exiting a peripheral area of the door 101, thereby locking or unlocking the door 101.

At this time, when the input member 111 is rotated by a cam coupling structure of the input member 111 and the engagement member 113, the engagement member 113 moves linearly so that its free end is caught by or released from the latch recess (not shown) of the container body (not shown). In this process, the linear movement of the engagement member 113 is performed at a preset angle of incline in the direction toward the container body (not shown) instead of being performed along a straight line.

As a structure with which the engagement member 113 moves along the angle of incline, a cam mechanism 115 is provided on a holding cover 120 which covers the engagement member 113, the door 101 and the locking unit 110.

The cam mechanism 115 includes a front end-side contact surface 115a, a base upper-side cam 115b, a front end-side cam 115c, a cam-pressing protrusion 115d, a base-side contact surface 115e and a base lower-side cam 115f. The front end-side contact surface 115a is formed on an area of both portions in the longitudinal direction of the engagement member 113 that is adjacent to the free end. The base upper-side cam 115b is formed on the opposite base side of the engagement member 113, and has an inclined structure. The front end-side cam 115c is formed on the door 101, has an inclined structure, and guides the front end-side contact surface 115a of the engagement member 113. The cam-pressing protrusion 115d is formed on the holding cover 120, and guides the base upper-side cam 115b of the engagement member 113. The base-side contact surface 115e is formed at the base side of the engagement member 113. The base lower-side cam 115f is formed in a recess 103 of the door 101 and has an inclined structure so as to guide the base-side contact surface 115e.

When the input member 111 is rotated in the direction in which the door 101 is locked due to this structure of the cam mechanism 115, the engagement member 113 linearly moves along a preset angle of incline. Then, the engagement member 113 brings the door 101 into tight contact with a side of a container body (not shown) as the free end thereof starts to be inserted into a latch recess (not shown) of the container body (not shown). When the free end of the engagement member 113 is completely inserted into the latch recess (not shown) of the container body (not shown), the door 101 comes into tight contact with the container body (not shown) with a strong attachment force.

However, "this door for a thin plate container" of the related art has a drawback in that the structure of the locking unit is very complicated. Here, the locking unit serves to impart linear movement at an angle of incline to the engagement member which is intended to bring the door into tight contact with a side of the container body.

That is, there are drawbacks in that, as described above, the locking unit includes the input member and the engagement member. In addition, a complicated cam structure, including the front end-side contact surface, the base upper-side cam, the front end-side cam, the cam-pressing protrusion, the base-side contact surface and the base lower-side cam, must be provided on the recessed portion of the door, on the inner surface of the holding cover and at several positions of the engagement member as a structure for operating the locking unit.

Accordingly, the overall structure of the door for a thin plate container becomes complicated and the number of components of the door is increased, thereby increasing the cost of molding or machining the door, the locking unit and the components, which leads to an increase in the unit price of products. In addition, the complicated structure lowers assemblability, thereby worsening productivity, which is problematic.

In particular, in "the door for a thin plate container" of the related art, the engagement member linearly moves at a present angle of incline so as to bring the door into tight contact with the side of the container body as the free end thereof is inserted into the latch recess of the container body. This consequently causes a problem in that particles are created through excessive frictional contact between the engagement member and the inner surface of the latch recess of the container body. Particles created as such raise a critical problem in that the thin plate, such as a wafer, contained in the container body is damaged.

In addition, in "the door for a thin plate container" of the related art, since the engagement member linearly moves at the present angle of incline so as to bring the door into tight contact with the side of the container body as the free end thereof is inserted into the latch recess of the container body, a strong rotating force is required at the point in time when the input member is rotated in the locking direction.

This requires dedicated process equipment which automatically operates the locking unit of the door in the semiconductor fabrication process to have a corresponding rotating force. This may cause a problem in that the locking unit does not cooperate with the process equipment.

In addition, since the free end of the engagement member moves along the incline toward the container body as it is inserted into the latch recess of the container body, when the position of the free end of the engagement member and the position of the latch recess of the container body do not correctly face each other before the door is locked, the free end of the engagement member may push the door in the opening direction while moving out of the latch recess of the container body in the locking operation, which is problematic.

This can cause the process equipment to malfunction, the door to be damaged and warped, and the semiconductor wafer contained inside the container body to be damaged, which are significantly problematic.

Accordingly, the present invention has been made keeping in mind the above problems occurring in the prior art, and an object of the present invention is to provide a door for a thin plate container which can be locked and unlocked using a simple structure and simple components, improve the sealing force thereof, and improve product assemblability and productivity.

In particular, provided is a door for a thin plate container which can prevent particles from being created during the process of locking or unlocking the door.

In addition, provided is a door for a thin plate container which has a locking unit which can harmoniously cooperate with process equipment.

SUMMARY OF THE INVENTION

In order to accomplish the above objects, the present invention provides a door for a thin plate container which closes an opening formed in a container body of a thin plate container in which a thin plate is received. The door includes: a door body having latch passage holes in circumferential portions thereof, the latch passage holes corresponding to latch recesses formed in an inner circumferential surface of the opening, and a component installation space; a rotary cam received in the component installation space such that the rotary cam can be manipulated to rotate; and latch arms each having one end connected to the rotary cam in the component installation space, the latch arms reciprocating depending on a direction of rotation of the rotary cam so that free end areas thereof enter or exit the latch recesses through the latch passage holes. When the rotary cam rotates in a locking direction, the latch arms move along straight lines until at least portions of the free end areas are inserted into the latch recesses and then pivot so that the free end areas are pressed toward the container body.

Here, it is preferred that the rotary cam include a cam body portion rotatably disposed in the component installation space; and cam profile portions protruding from circumferential portions of a rear surface of the cam body portion toward a bottom of the component installation space, the cam profile portions being connected to one ends of the latch arms such that the cam profile portions and the latch arms can mutually move relative to each other, thereby guiding linear movement and pivoting of each of the latch arms.

Here, it is effective that each of the cam profile portions includes a linear cam profile extending from a point (A) on an area between a center and a circumferential end of the cam body portion to a point (B) on the circumferential end of the cam body portion, the point (B) being circumferentially spaced apart from the point (A), in which the linear cam profile guides a corresponding latch arm of the latch arms to move along a straight line; and a pivotal cam profile being gradually bent toward the container body along a central axis of the rotary cam while being circumferentially spaced apart from the point (B) on the circumferential end of the cam body portion, in which the pivotal cam profile guides a corresponding latch arm of the latch arms to pivot.

In addition, it is more preferred that a segment of the linear cam profile is defined corresponding to a segment in which insertion of the free end area of the corresponding latch arm into a corresponding latch recess of the latch recesses is completed.

In addition, it is more effective that the linear cam profile and the pivotal cam profile are shaped as slots, and the corresponding latch arm has a cam protrusion on one end thereof which relatively moves along the slots.

Here, it is preferred that an anti-release piece having an increased diameter is provided on a free end of the cam protrusion.

In addition, it is effective that the anti-release piece is elastically attachable to and detachable from the slots with an external force that is greater than a rotating force of the rotary cam.

In the meantime, it is more preferred that a cam stopper is provided on a bottom of the component installation space where the rotary cam is disposed, the cam stopper maintaining the rotary cam in a state where rotation of the rotary cam in a locking direction is completed, and that the rotary cam has a stopper which elastically engages with the cam stopper in an area where the rotation of the rotary cam in the locking direction is completed.

In addition, it is more effective that each of the cam profile portions further includes a stopping cam profile circumferentially extending at a same radius with respect to one point of the central axis of the rotary cam from the last point (C) of the pivotal cam profile that is opposite the point (B) on the circumferential end of the cam body portion. The stopping cam profile guides the stopper and the cam stopper to engage with or disengage from each other.

In the meantime, it is preferred that the guide recesses which correspond to the straight lines are formed in both lateral sides of areas of the latch arms adjacent to the free ends and guide protrusions which relatively move along the guide recesses are formed portions of the component installation space which correspond to the both lateral sides, and/or the guide recesses are formed on the portions of the component installation space which correspond to the both lateral sides and the guide recesses are formed on the both lateral sides of the areas of the latch arms adjacent to the free ends.

In addition, it is effective that the latch passage holes are symmetrically formed on both circumferential portions of the door body which are opposite each other, and that the component installation space, the cam profile portions of the rotary cam and the latch arms are symmetric toward the both latch passage holes with respect to a center of the rotary cam.

In the meantime, it is more preferred that the door further includes a locking unit cover which detachably covers an installation area of the rotary cam and a partial area of the component installation space adjacent to the rotary cam.

Here, it is more effective that the rotary cam is provided with a manual manipulation portion, and that the locking unit cover is provided with a manual manipulation opening which exposes the manual manipulation portion to an outside.

In the meantime, it is preferred that the rotary cam and the both latch arms constitute one locking unit, and a pair of the locking units are provided on both sides of the door body, and that the latch passage holes, the component installation space and the locking unit cover are provided so as to correspond to the locking units.

Advantageous Effects

The door for a thin plate container is provided according to the present invention. The door can be locked and unlocked using a simple structure and simple components, the sealing force of the door is improved, and product assemblability and productivity can be improved.

In addition, the door for a thin plate container can prevent particles from being created in the process of locking or unlocking the door.

Furthermore, the door for a thin plate container has a locking unit which can harmoniously cooperate with process equipment.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
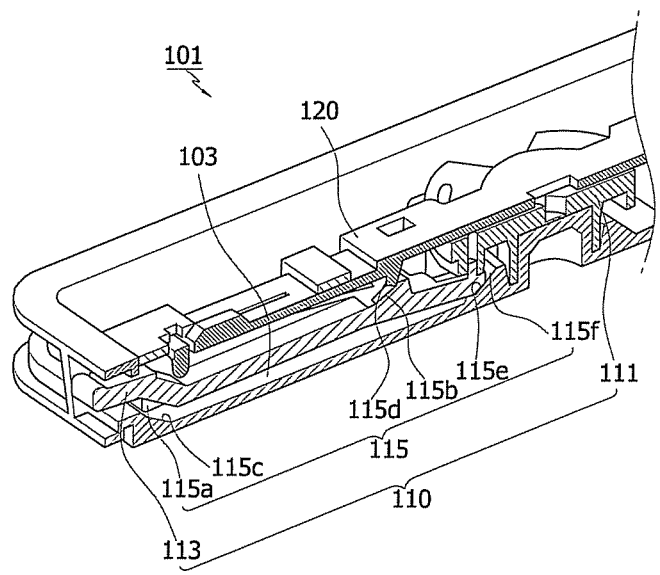
FIG. 1 is a fragmentary perspective view showing an area of a locking unit of a door for a thin plate container of the related art.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
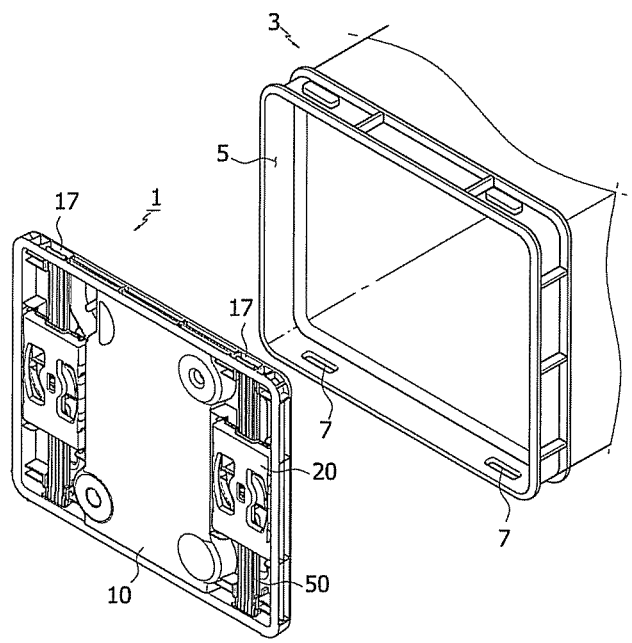
FIG. 2 is a perspective view showing a door for a thin plate container according to the present invention.
Figure 3:
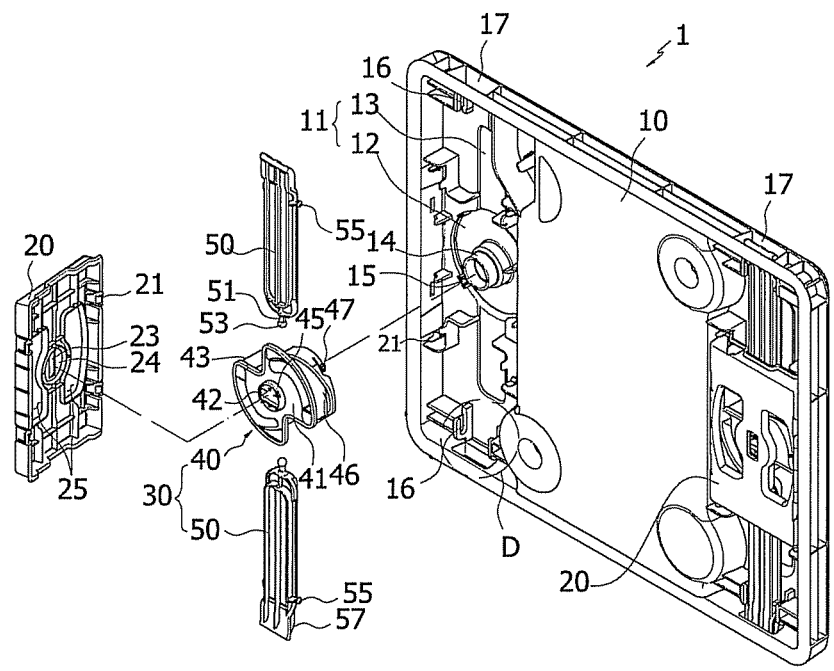
FIG. 3 is an exploded perspective view of the door for a thin plate container shown in FIG. 2.

As shown in FIG. 2 and FIG. 3, a door 1 for a thin plate container according to the present invention includes a door body 10 and a locking unit 30. The door body 10 opens or closes an opening 5 formed in at least one portion of a container body 3 which contains a thin plate such as a semiconductor wafer. The locking unit 30 is provided in the door body 10 in order to lock or unlock the opening 5 of the container body 3 which is in the closed state.

The door body 10 can have a shape corresponding to the opening 5 of the container body 3. It is preferred that the door body 10 have an oblong shape that corresponds to the shape of the opening 5 of the container body 3 which contains a common semiconductor wafer or the like.

The door body 10 has latch passage holes 17 in circumferential ends thereof that correspond to latch recesses 7 formed in the opening 5 of the container body 3. The latch recesses 7 and the latch passage holes 17 are respectively formed in the opposite inner sides of the opening 5 of the container body 3 and the opposite circumferential ends of the door body 10. In consideration of the locked, state and sealing balance of the door 1, it is preferred that the latch recesses 7 and the latch passage holes 17 be symmetrically formed in the upper and lower areas in the right and left sides when viewed from the front of the door 1.

In addition, the door body 10 has a component installation space 11 in which the locking unit 30 is provided. The component installation space 11 is preferably formed by being recessed in from the outer surface of the plate of the door body 10. Preferably, the component installation space 11 has a cam installation portion 12 in the middle area thereof and latch installation portions 13 in the areas extending from both sides of the cam installation portion 12 to the side of the latch passage holes 17. A rotary cam 40 which will be described later is provided in the cam installation portion 12, and latch arms 50 which will be described later are provided in the latch installation portions 13.

A cam support shaft 14 which rotatably supports the rotary cam 40 is provided in the central portion of the cam installation portion 12 of this component installation space 11, and a plurality of cam stoppers 15 which limit the direction, range and position in which the rotary cam 40 is locked or unlocked is provided in the surrounding area of the cam support shaft 14.

In addition, the latch installation portions 13 are respectively provided with guide recesses 16 which guide linear movement of the latch arms 50 which will be described later. The guide recesses 16 are provided corresponding to guide protrusions 55 which are provided lateral-directionally on both sides of the latch arms 50 which will be described later. In some cases, the guide recesses 16 may be provided in lateral-directional both sides of the latch arms 50, and the guide protrusions 55 may be provided on the latch installation portions 13.

In addition, a gasket 18 is provided on the circumferential end of the door body 10 in the circumferential direction such that the opening 5 of the container body 3 can be sealed airtight.

In the meantime, it is preferred that the door 1 for a thin plate container according to the present invention include a locking unit cover 20 which covers at least the cam installation portion 12 of the component installation space 11 of the door body 10. The locking unit cover 20 can partially cover the latch installation portions 13 which are adjacent to the cam installation portion 12. In some cases, the locking unit cover 20 can of course be configured such that it covers the entire area of the component installation space 11 or the entire outer surface of the front of the door body 10.

This locking unit cover 20 is detachably coupled to the door body 10 without using separate coupling components such as bolts. For this, an attachment/detachment structure 21 is provided on a plurality of areas of the locking unit cover 20 and a plurality of corresponding areas of the door body 10. The attachment/detachment structure 21 includes hooks and hook recesses, fitting protrusions and fitting recesses, or the like.

In addition, a key passage hole 23 corresponding to a key recess 42 of the rotary cam 40 which will be described later is provided in the central portion of the locking unit cover 20, and a cam support portion 24 which rotatably supports the rotary cam 40 is provided on the rear surface of the central portion that faces toward the cam installation portion 12.

In addition, it is preferred that manual manipulation openings 25 be provided around the key passage hole 23, with which an operator can manually rotate manipulation portions 43 of the rotary cam 40 which will be described later.

In the meantime, the locking unit 30 includes the rotary cam 40 which is rotatably provided on the component installation space 11 of the door body 10 and the latch arms 50 which lock and unlock the closed state of the door 1 in response to the rotary cam 40 which is manipulated to rotate.

Figure 4:
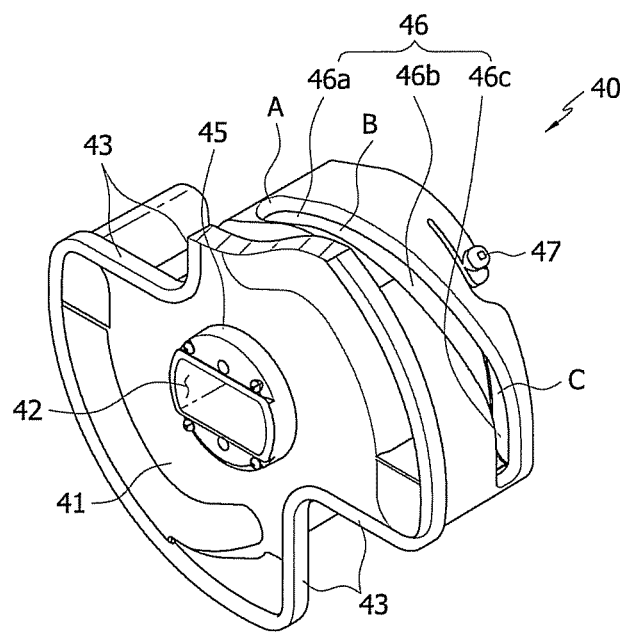
FIG. 4 is an enlarged perspective view of the rotary cam shown in FIG. 3.
Figure 5:
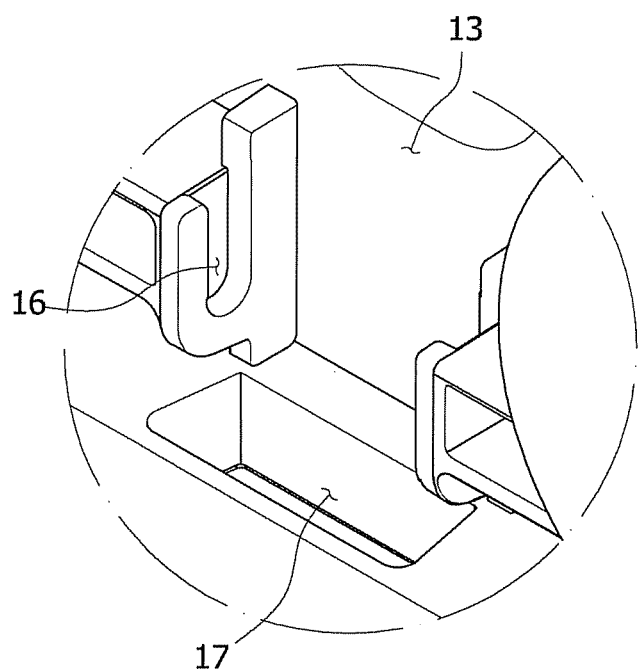
FIG. 5 is an enlarged perspective view of the region "D" in FIG. 3.

As shown in FIG. 3 and FIG. 4, the rotary cam 40 has a cam body portion 41 which is coupled to the cam installation portion 12 of the component installation space 11 such that it can rotate in both directions, cam profile portions 46 which are integrally provided on the circumference of the cam body portion 41 in order to guide linear movement and pivoting of the latch arms 50, and stoppers 47 which limit locking and unlocking positions of the rotary cam 40.

The position key recess 42 is formed in the central portion of the cam body portion 41, coaxially with the key passage hole 23 of the locking unit cover 20, and the manual manipulation portions 43 are symmetrically provided around the position key recess 42, with which the rotary cam 40 can be manually manipulated.

The key recess 42 corresponds to a key of dedicated process equipment which automatically operates the locking unit 30 in a semiconductor wafer manufacturing process. In addition, the manual manipulation portions 43 allow the operator to manually manipulate and rotate the rotary cam 40 through the manual operation openings 25 of the locking unit cover 20.

In addition, a shaft portion 45 and a shaft recess (not shown) are provided on the central portions of the front and rear surfaces of the cam body portion 41, and are respectively rotatably supported on the cam support portion 24 of the locking unit cover 20 and the cam installation portion 12 of the component installation space 11. In this case, the cam support shaft 14 and the shaft recess (not shown) can be formed at opposite positions, and the shaft portion 45 and the cam support portion 24 can also be formed at opposite positions.

The cam profile portions 46 are configured such that they protrude from the circumferential portions of the rear surface of the cam body portion 41 in the direction toward the bottom side of the cam installation portion 12. The bottom surface of the cam installation portion 12 corresponding to the cam profile portion 46 can be a circle that is recessed to a preset depth in order to position the rotary cam 40.

Each of these cam profile portions 46 has a linear cam profile 46*a*, a pivotal cam profile 46*b* and a stopping cam profile 46*c*. The linear cam profile 46*a* guides a corresponding latch arm of the latch arms 50 to move along a straight line so that the free end area of the latch arm 50 to enter and exit a corresponding latch recess of the latch recesses 7 of the container body 3 moves along a straight line. The pivotal cam profile 46*b* guides a corresponding latch arm of the latch arms 50 to press or stop pressing the door 1 toward the container body 3 in response to pivoting in the state in which the free end area of the latch arm 50 is inserted into the latch recesses 7 of the container body 3. The stopping cam profile 46*c* guides a corresponding stopper of the stoppers 47 and a corresponding cam stopper of the cam stoppers 15 to engage with or disengage from each other.

The linear cam profile 46*a* extends from one point "A" on the area between the center and the circumferential end of the cam body portion 41 to one point "B" on the circumferential end of the cam body portion 41 which is circumferentially spaced apart from the point "A."

In addition, the pivotal cam profile 46b is configured such that it is gradually bent toward the container body 3 along the central axis of the rotary cam 40 while being circumferentially spaced apart from the point "B" on the circumferential end of the cam body portion 41.

In addition, the stopping cam profile 46c circumferentially extends to the point where the stopper 47 and the cam stopper 15 engage with each other at the same radius with respect to one point of the central axis of the rotary cam 40 from the last point "C" of the pivotal cam profile 46b.

These linear cam profile 46a, pivotal cam profile 46b and stopping cam profile 46c have the shape of slots which are connected together, and guide linear movement and pivoting of the latch arm 50 while being connected to cam protrusion 51 of the latch arm 50 which will be described later.

Of course, it is also possible to guide the linear movement and pivoting of the latch arm 50 by imparting the linear cam profile 46a, the pivotal cam profile 46b and the stopping cam profile 46c with the shape of protruding ribs and configuring the latch arms 50 so as to have rib recesses to which the ribs are connected.

The stoppers 47 limit or maintain the range and position in which the rotary cam 40 is locked or unlocked. It is preferred that the stoppers 47 elastically engage with or disengage from the cam stoppers 15 at the point where the rotation of the rotary cam 40 in the locking direction ends or the rotation of the rotary cam in the unlocking direction starts.

In the meantime, the latch arms 50 have the shape of linear bars having a preset width.

The cam protrusions 51 are provided on one ends of the latch arms 50, and relatively move along the slots of the linear cam profile 46a, the pivotal cam profile 46b and the stopping cam profile 46c of the rotary cam 40.

It is preferred that the cam protrusions 51 be respectively provided with anti-release pieces 53 at the free ends thereof, the anti-release pieces 53 being at least partially increased in diameter in order to allow the cam protrusions 51 to relatively move in the state where they are inserted into the slots and prevent the cam protrusions 51 from being accidently released from the slots.

At this time, it is possible to improve assemblability and prevent accidental dislodgment by designing the anti-release pieces 53 such that they are elastically inserted into or released from the slots with an external force greater than the rotating force of the rotary cam 40.

In addition, a pair of guide protrusions 55 which protrude from both sides in the lateral direction are provided on the free end areas of the latch arms 50. The guide protrusions 55 relatively move along a straight line in the guide recesses 16 formed in the latch installation portions 13 of the door body 10, thereby guiding the latch arms 50 to move along a straight line.

The guide protrusions 55 act as the center of pivoting of the latch arms 50, and are formed as protrusions having a circular cross-section such that the latch arms 50 smoothly pivot. Of course, as described above, in some cases, the guide recesses 16 may be formed in both sides of the latch arms 50 in the lateral direction, and the guide protrusions 55 may be formed on the latch installation portions 13.

In addition, it is preferred that insertion guide surfaces 57 be formed on the free end areas of the latch arms 50. The side cross-sectional structure of the insertion guide surfaces 57 is curved or inclined in order to facilitate the operation of entering and exiting the latch recesses 7 of the container body 3.

A description will be given of the process of locking or unlocking the closed state of the opening 5 of the container body 3 using the door 1 for a thin plate container according to the present invention having the above-described construction.

Figure 6A:
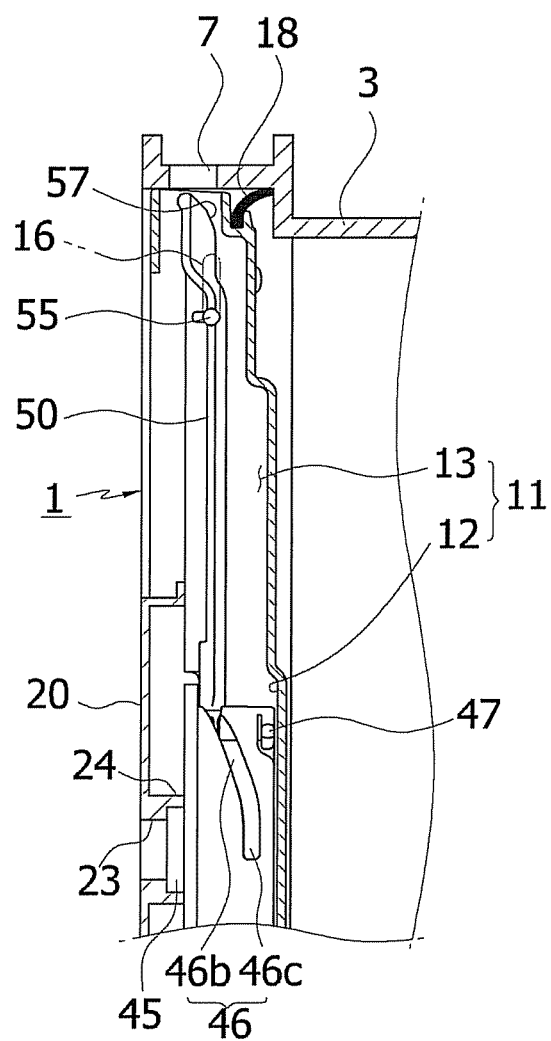
FIG. 6a to FIG. 8b are views illustrating the operating state of the locking unit.
Figure 6B:
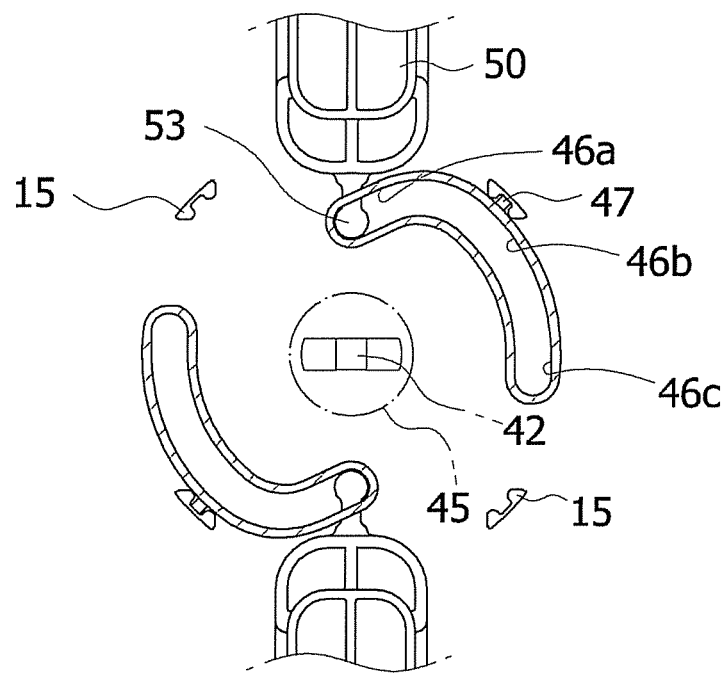

First, as shown in FIG. 6a, the opening 5 of the container body 3 is closed with the door 1. At this state, as shown in FIG. 6b, the cam protrusion 51 of the latch arm 50 is positioned at the end portion of the slot of the linear cam profile 46a of the rotary cam 40, and the locking unit 30 is unlocked. The latch arm 50 is positioned inside the component installation space 11 of the door body 10.

Figure 7A:
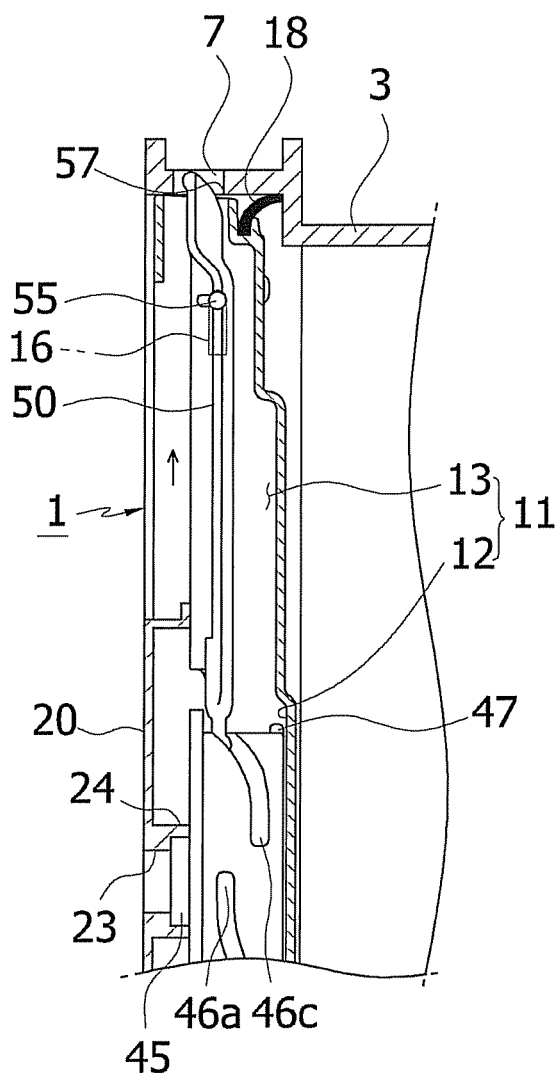
Figure 7B:
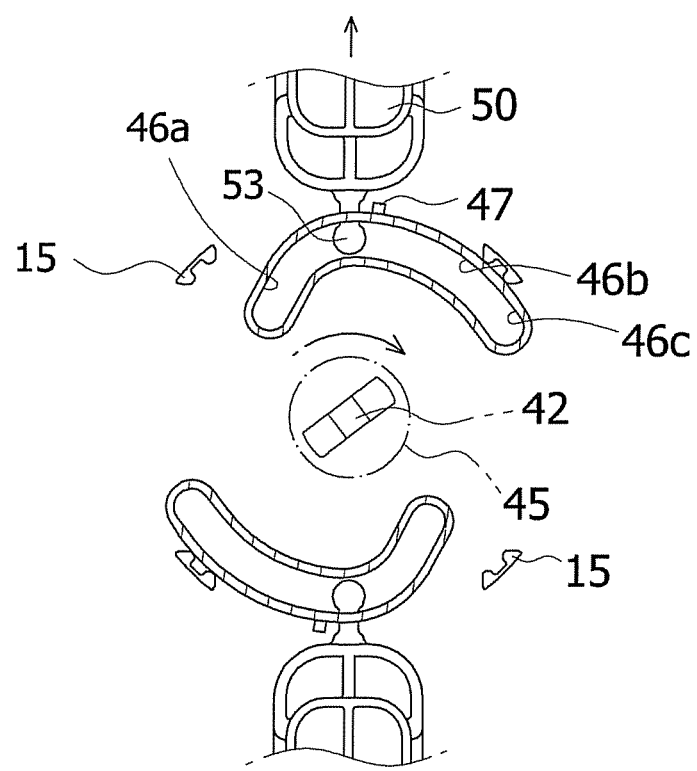

In this state, as shown in FIG. 7b, when the rotary cam 40 is rotated in the locking direction, the cam protrusion 51 of the latch arm 50 relatively moves along the slot segment of the linear cam profile 46a of the rotary cam 40, thereby moving the latch arm 50 along a straight line in the locking direction. Consequently, as shown in FIG. 7a, the free end of the latch arm 50 is inserted into the latch recess 7 of the container body 3 along a straight line so that the door 1 is locked.

Figure 8A:
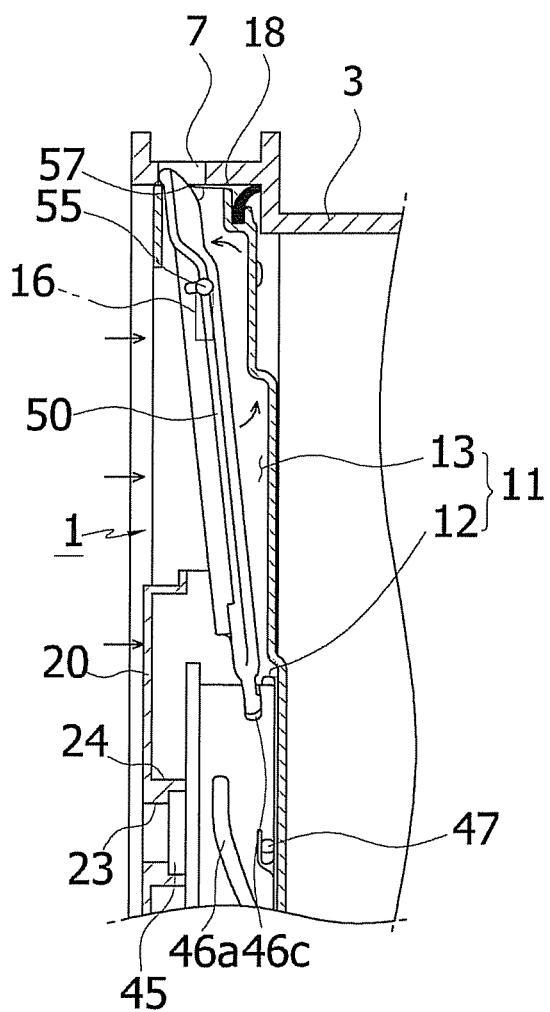
Figure 8B:
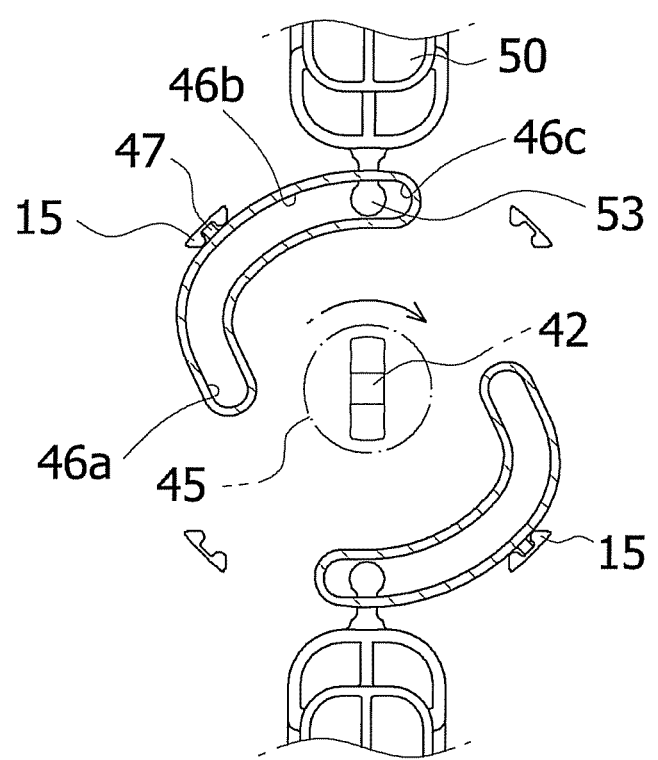

In addition, as shown in FIG. 8b, when the rotary cam 40 is continued to rotate in the locking direction, the cam protrusion 51 of the latch arm 50 relatively moves along the slot segment of the pivotal cam profile 46b of the rotary cam 40. Consequently, as shown in FIG. 8a, the latch arm 50 pivots in such a fashion that the free end of the latch arm 50 inserted into the latch recess 7 presses the door 1 toward the container body 3. Here, the latch arm 50 pivots around the guide protrusion 55. Consequently, the door 1 is strongly and tightly brought into contact with the area of the opening 5 of the container body 3, thereby sealing the container body 3 with a strong sealing force.

When the rotary cam 40 is continued to rotate in the locking direction from this state, the stopper 47 of the rotary cam 40 engages with the cam stopper 15 as the cam protrusion 51 of the latch arm 50 relatively moves along the slot segment of the stopping cam profile 46c of the rotary cam 40. Consequently, the door 1 can maintain the locked state and the strong sealing state.

In the meantime, as shown in FIG. 8a and FIG. 8b, when the door 1 is opened from the state where the door 1 is locked, rotating the rotary cam 40 in the unlocking direction causes the stopper 47 to disengage from the cam stopper 15 and the cam protrusion 51 of the latch arm 50 to relatively move in the opposite direction along the slot segment of the stopping cam profile 46c of the rotary cam 40.

In addition, when the rotary cam 40 continues to rotate in the unlocking direction, the cam protrusion 51 of the latch arm 50 relatively moves along the slot segment of the pivotal cam profile 46b of the rotary cam 40, in the direction opposite to what was indicated above. Consequently, the latch arm 50 pivots in the direction in which the latch arm 50 inserted into the latch recess 7 is released from being pressed. Accordingly, as shown in FIG. 7a, the door 1 is released from the tight contact with the area of the opening 5 of the container body 3.

When the rotary cam 40 continues to rotate in the unlocking direction from this state, the cam protrusion 51 of the latch arm 50 linearly moves the latch arm 50 in the unlocking direction while relatively moving along the slot segment of the linear cam profile 46a of the rotary cam 40 in the direction opposite to what was indicated above. Consequently, as shown in FIG. 6a, the free end of the latch arm 50 is linearly withdrawn from the latch recess 7 of the container body 3 toward the component installation space 11 of the door body 10 so that the door 1 is unlocked. At this time, the segment in which the rotary cam 40 rotates for the unlocking operation is limited so as to correspond to the segment where the free end of the latch arm 50 exits the latch recess 7 due to the cam stopper 15 and is received in the component installation space 11 of the door body 10.

According to door 1 for a thin plate container according to the present invention as such, the rotary cam 40 does not require a strong rotating force since the latch arm 50 moves along a straight line until the free end of the latch arm 50 is completely inserted into the latch recess 7 after the start of insertion.

Accordingly, the door 1 can harmoniously cooperate with dedicated process equipment which automatically operates the locking unit 30 of the door 1.

In addition, in the door 1 for a thin plate container according to the present invention, there is no danger that the latch arm 50 may push the door 1 outward of the container body 3 at the initial stage of the process of locking the door 1, since the latch arm 50 moves along a straight line until the free end of the latch arm 50 is completely inserted into the latch recess 7 after the start of insertion. Accordingly, it is possible to prevent the process equipment from malfunctioning, the door 1 from being damaged or warped, and a wafer from being damaged in the process of locking the door 1.

In the meantime, in the door 1 for a thin plate container according to the present invention, the construction and structure of the locking unit 30 for bringing the door 1 into tight contact with the container body 3 are embodied merely as a simple structure in which the rotary cam 40 and the latch arm 50 are coupled with each other and a simple guide structure for moving the latch arm 50 along a straight line.

Accordingly, the overall structure of the door 1 for a thin plate container, becomes very simple, and the unit price of products can be reduced due to the simple construction and structure. Assemblability and productivity are also improved.

In particular, in the door 1 for a thin plate container according to the present invention, after the free end of the latch arm 50 is inserted into the latch recess 7 through linear movement, the free end of the latch arm 50 presses the door toward the container body while coming into contact with the inner surface of the latch recess 7. Consequently, there is no danger that particles may be created while the free end of the latch arm 50 is inserted into the latch recess 7.

Accordingly, it is possible to prevent a thin plate such as a wafer contained in the container body 3 from being damaged by particles during the process of locking or unlocking the door 1.

The door for a thin plate container is provided according to the present invention. The door can be locked and unlocked using a simple structure and simple components, the sealing force of the door is improved, and product assemblability and productivity can be improved.

In addition, the door for a thin plate container can prevent particles from being created in the process of locking or unlocking the door.

Furthermore, the door for a thin plate container has a locking unit which can harmoniously cooperate with process equipment.

Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. A door for a thin plate container which closes an opening formed in a container body of a thin plate container in which a thin plate is received, the door comprising:
   a door body having latch passage holes in circumferential portions thereof, the latch passage holes corresponding to latch recesses formed in an inner circumferential surface of the opening, and a component installation space;
   a rotary cam received in the component installation space such that the rotary cam can be manipulated to rotate; and
   latch arms each having one end connected to the rotary cam in the component installation space, the latch arms reciprocating depending on a direction of rotation of the rotary cam so that free end areas thereof enter or exit the latch recesses through the latch passage holes,
   wherein, when the rotary cam rotates in a locking direction, the latch arms move along straight lines until at least portions of the free end areas are inserted into the latch recesses and then pivot so that the free end areas are pressed toward the container body,
   wherein the rotary cam comprises:
   a cam body portion rotatably disposed in the component installation space; and
   cam profile portions protruding from circumferential portions of a rear surface of the cam body portion toward a bottom of the component installation space, the cam profile portions being connected to one ends of the latch arms such that the cam profile portions and the latch arms can mutually move relative to each other, thereby guiding linear movement and pivoting of each of the latch arms,
   wherein each of the cam profile portions comprises:
   a linear cam profile extending from a point (A) on an area between a center and a circumferential end of the cam body portion to a point (B) on the circumferential end of the cam body portion, the point (B) being circumferentially spaced apart from the point (A), wherein the linear cam profile guides a corresponding latch arm of the latch arms to move along a straight line; and
   a pivotal cam profile being gradually bent toward the container body along a central axis of the rotary cam while being circumferentially spaced apart from the point (B) on the circumferential end of the cam body portion, wherein the pivotal cam profile guides a corresponding latch arm of the latch arms to pivot.

2. The door according to claim 1, wherein a segment of the linear cam profile is defined corresponding to a segment in which insertion of the free end area of the corresponding latch arm into a corresponding latch recess of the latch recesses is completed.

3. The door according to claim 2, wherein the linear cam profile and the pivotal cam profile are shaped as slots, and the corresponding latch arm has a cam protrusion on one end thereof which relatively moves along the slots.

4. The door according to claim 3, wherein an anti-release piece having an increased diameter is provided on a free end of the cam protrusion.

5. The door according to claim 4, wherein the anti-release piece is elastically attachable to and detachable from the slots with an external force that is greater than a rotating force of the rotary cam.

6. The door according to claim 1, wherein a cam stopper is provided on a bottom of the component installation space where the rotary cam is disposed, the cam stopper maintaining the rotary cam in a state where rotation of the rotary cam in a locking direction is completed, and the rotary cam has a stopper which elastically engages with the cam stopper in an area where the rotation of the rotary cam in the locking direction is completed.

7. The door according to claim 6, wherein each of the cam profile portions further comprises a stopping cam profile circumferentially extending at a same radius with respect to one point of the central axis of the rotary cam from the last point (C) of the pivotal cam profile that is opposite the point (B) on the circumferential end of the cam body portion, wherein the stopping cam profile guides the stopper and the cam stopper to engage with or disengage from each other.

8. The door according to claim 1, wherein guide recesses which correspond to the straight lines are formed in areas on both lateral sides of the latch arms adjacent to the free ends and guide protrusions which relatively move along the guide recesses are formed in portions of the component installation space which correspond to the both lateral sides, or the guide recesses are formed on the portions of the component installation space which correspond to the area on the both lateral sides of the latch arms and the guide protrusions are formed on the area on the both lateral sides of the latch arms adjacent to the free ends.

9. The door according to claim 5, wherein
the latch passage holes are symmetrically formed on both circumferential portions of the door body which are opposite each other, and
the component installation space, the cam profile portions of the rotary cam and the latch arms are symmetric toward the both latch passage holes with respect to a center of the rotary cam.

10. The door according to claim 9, further comprising a locking unit cover which detachably covers an installation area of the rotary cam and a partial area of the component installation space adjacent to the rotary cam.

11. The door according to claim 10, wherein the rotary cam is provided with a manual manipulation portion, and the locking unit cover is provided with a manual manipulation opening which exposes the manual manipulation portion to an outside.

12. The door according to claim 11, wherein
the rotary cam and the both latch arms constitute one locking unit, and a pair of the locking units are provided on both sides of the door body, and
the latch passage holes, the component installation space and the locking unit cover are provided so as to correspond to the locking units.

13. The door according to claim 7, wherein
the latch passage holes are symmetrically formed on both circumferential portions of the door body which are opposite each other, and
the component installation space, the cam profile portions of the rotary cam and the latch arms are symmetric toward the both latch passage holes with respect to a center of the rotary cam.

14. The door according to claim 13, further comprising a locking unit cover which detachably covers an installation area of the rotary cam and a partial area of the component installation space adjacent to the rotary cam.

15. The door according to claim 14, wherein
the rotary cam is provided with a manual manipulation portion, and the locking unit cover is provided with a manual manipulation opening which exposes the manual manipulation portion to an outside.

16. The door according to claim 15, wherein
the rotary cam and the both latch arms constitute one locking unit, and a pair of the locking units are provided on both sides of the door body, and
the latch passage holes, the component installation space and the locking unit cover are provided so as to correspond to the locking units.

17. The door according to claim 8, wherein
the latch passage holes are symmetrically formed on both circumferential portions of the door body which are opposite each other, and
the component installation space, the cam profile portions of the rotary cam and the latch arms are symmetric toward the both latch passage holes with respect to a center of the rotary cam.

18. The door according to claim 17, further comprising a locking unit cover which detachably covers an installation area of the rotary cam and a partial area of the component installation space adjacent to the rotary cam.

19. The door according to claim 18, wherein
the rotary cam is provided with a manual manipulation portion, and the locking unit cover is provided with a manual manipulation opening which exposes the manual manipulation portion to an outside.

20. The door according to claim 19, wherein
the rotary cam and the both latch arms constitute one locking unit, and a pair of the locking units are provided on both sides of the door body, and
the latch passage holes, the component installation space and the locking unit cover are provided so as to correspond to the locking units.

* * * * *